United States Patent [19]

Otty

[11] Patent Number: 4,634,620

[45] Date of Patent: Jan. 6, 1987

[54] STITCH BONDED ELECTRICALLY INSULATING BOARD

[76] Inventor: Malcolm Otty, 27 Column Road, West Kirby, Liverpool, England

[21] Appl. No.: 631,896

[22] Filed: Jul. 18, 1984

[30] Foreign Application Priority Data

Jul. 20, 1983 [GB] United Kingdom ............... 8319564

[51] Int. Cl.$^4$ ............................................. B05D 5/12
[52] U.S. Cl. .................................. 428/102; 428/103; 428/104; 428/901; 428/902
[58] Field of Search ............... 428/102, 103, 104, 901, 428/902

[56] References Cited

U.S. PATENT DOCUMENTS

| 3,855,047 | 12/1974 | Groff | 174/68.5 |
| 4,321,499 | 3/1982 | Gupta | 310/268 |
| 4,407,876 | 10/1983 | Otty | 428/102 |

FOREIGN PATENT DOCUMENTS 2027466  2/1980  United Kingdom .

OTHER PUBLICATIONS

Gates, L. E., Jr. and Reimann, W. G., "Quartz Fibers in PCBs Improves Temperature Stability," *Electronic Packaging & Production*, May, 1983.

Kelly, Edward, "The Genesis of Multilayer Materials," *Proceedings of the Technical Program*, National Electronic Packaging and Production Conference, Feb. 24, 26, 1981.

Crosby, J. M. and K. L. Talley, "A Designer's Guide to Reinforced Flame Retardant Thermoplastic Composites," *Proceedings, Fifteenth Annual Connectors and Interconnection Technology Symposium*, Electronic Connector Study Group, Inc., Nov. 1982.

Erickson, Dallas, "PC Laminate Materials," *Electronic Packaging and Production*, Dec. 1980.

*Kirk-Othmer Encyclopedia of Chemical Technology*, third ed., vol. 2, "Amines, Aromatic (Phenylenediamines)", p. 352, 1978.

*Kirk-Othmer Encyclopedia of Chemical Technology*, third ed., vol. 3, "Aramid Fibers," pp. 213, 214, 1978.

Primary Examiner—Marion C. McCamish
Attorney, Agent, or Firm—Oblon, Fisher, Spivak, McClelland, & Maier

[57] ABSTRACT

An electrically insulating board suitable inter alia for use as printed circuit board is made by impregnating a stitch bonded fabric comprising high temperature fibres such as Nomex (RTM) and curing the resin by hot pressing.

10 Claims, 3 Drawing Figures

STITCH BONDED ELECTRICALLY INSULATING BOARD

BACKGROUND OF THE INVENTION

This invention relates to electrically insulating board.

In my earlier U.S. Pat. No. 4,407,876 I described an electrically insulating wrapping material for electrical machinery comprising high temperature fibres (such as "Nomex"—Registered Trade Mark) in the form of a stitch bonded fabric. Nomex is poly(m-phenyleneisophthalamide), which is an aromatic polyamide, or "aramid." The method of fabrication is inexpensive because it uses mainly fibres and no, or only a little, yarn and yields a flexible wrapping tape which is better adapted to cover the corners of diamond-shaped coils of electrical rotating machinery when used as a wrapped insulation intended for resin impregnation. Hitherto, relatively stiff paper tapes of Nomex fibres have been used for this purpose which have the disadvantage that at such awkward bends as are encountered on coils, the winding 'gaped' and left a spot with inadequate insulation. The inherent, textile-type flexibility of the stitch bonded tape overcomes this problem completely.

I have now found that the stitch bonded fabric of high temperature fibres has another use in electrical insulation which however is wholly surprising even over my previous invention.

BRIEF DESCRIPTION OF THE INVENTION

According to the present invention, I provide an electrically insulating board comprising a stitch bonded fabric comprising high temperature fibres impregnated with resin, the resin being cured by hot pressing.

Hot pressing, of course, is a step carried out in the making of electrically insulated diamond and other coils for electrical rotating machinery. The resin can be applied to a wrapped coil by vacuum and pressure imnpregnation, the thus impregnated coil being subject to heat and pressure in a press which moulds the impregnated wrapping to the shape of the slot it is intended to fit in the machinery.

A similar operation will be carried out in connection with the present invention, but instead of shaping the impregnated fabric, when wrapped around a coil, to fit a slot, the hot pressing will be effected on the impregnated material itself and in such a way as to produce a board of the desired shape and size.

It is surprising to find that the stitch bonded fabric is useful in this way. (In this first place, it is—despite its low fabrication cost—an expensive material on account of the high cost of the fibres and yarns suitable for making it. Its principal advantage, in the wrapping of coils, was its textile-type flexibility. This property is clearly of little importance for the manufacture of stiff board. Indeed the inherent flexibility of the material might be thought disadvantageous in the manufacture of stiff board, and this, together with its high cost, would seem to rule it out for this purpose.

I have now found, however, that the stitch bonded fabric is in fact very well suited to the manufacture of board. One reason for this is that the fabric is a very good absorber of resin, particularly under vacuum and pressure impregnation conditions, so that a board can be formed on hot pressing which has no voids and has therefore a high integrity of electrical insulation. The high temperature fibres put the resulting board into the highest class of electrical insulating materials—the board is suitable for use in class F, H or C material.

The absence of voids can be further assured by using solventless resins, thereby avoiding problems associated with solvent residues which can leach out in use leaving low impedance tracks in the board.

A further advantage, again quite unexpected, is that board according to the invention can be machined into a desired shape better than conventional boards, leaving firm edges that do not tend to disintegrate. This can be in part due to the fact that resins bond better to the high temperature fabrics, and in particular, the fleecy stitch bonded fabrics of the present invention than to conventional glass reinforcing threads. It can also, however, be the result of being able to use a resin selected from a wider class of resins including solventless resins that can better adhere to the fibres.

It is preferred to use warp thread stitch bonded fabric, in which the stitching thread is also of high temperature material—preferably the fabric is stitch locked so that the threads have no or a reduced tendency to pull out. However a non-yarn or fleece stitch bonded fabric can also be used. Such a fabric has less strength than yarn stitch bonded fabric, but because the invention also contemplates using solventless resins which implies that the vertical tower impregnation technique necessary with solvented resins can be replaced by a horizontal vacuum/pressure technique, even low strength substrates can be used according to this invention.

The fabric may be contained in more than one layer, so that boards of different thickness can be produced. A typical stitch bonded fabric would have a weight of about 200 grams per square meter, and a single layer of such fabric when impregnated and hot pressed to cure the resin would be suitable for use as printed circuit board, which would be provided on one or both faces with a plating of etchable metal. Multilayer boards would be useful for more robust end uses—as mountings for components in control panels and in electrical equipment generally.

However, since stitch bonded fabric can be produced in a range of higher weights, and since it can, using solventless resins and vacuum/pressure impregnation techniques be impregnated in heavier weights and even two or more layers at a time, heavier boards can be readily produced substantially less expensively than conventional glass based board. Moreover, by virtue of the stitch bonded, as opposed to the woven fabric configuration, when more than one fabric layer is used, the fleecier nature of the cloth and the fact that resin systems can be used which have substantially higher adhesion to the fibres than to glass, interlaminar separation, which is a problem with glass based boards, is eliminated. Further by virtue of the choice of resin systems, the better adhesion and the absence of brittleness in the fibres, moisture cannot penetrate even through cut edges or drill holes e.g. for through plating on double sided printed circuit boards, thus further ensuring the long term integrity of electronic equipment built on board according to this invention.

The hot pressed impregnated material has good strength and stability and would be especially suitable for such applications as the rotors of printed circuit motors where good mechanical properties are required in addition to good thermal and electrical insulation properties.

The stitch bonded fabric is easier to work with than loose fillers and is in particular easier than glass fibres and less hazardous. It can readily be cut to any shape should unusually shaped boards be required, and of course its flexibility means that non-planar boards can be made if desired. The material can even be sewn or moulded into more complicated structures, such as cones, tubes and spherical shapes.

BRIEF DESCRIPTION OF THE DRAWINGS

Embodiments of electrically insulating board according to the invention will now be described with reference to the accompanying drawings, in which.

DETAILED DESCRIPTION OF THE PREFERRED EMBODIMENTS

Figure 1:
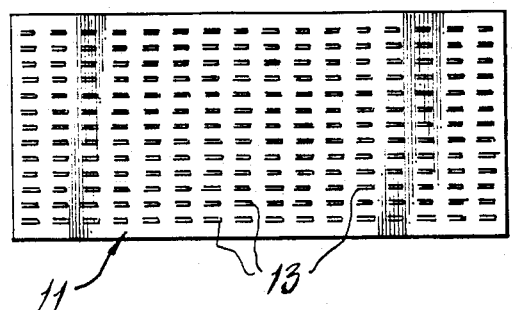
FIG. 1 is a plan view of a single layer board suitable for plating with etchable metal.
Figure 2:
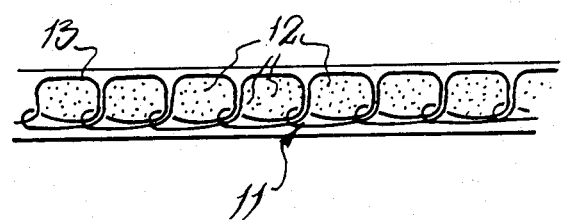
FIG. 2 is a cross-section to a larger scale of the board illustrated in FIG. 1.
Figure 3:
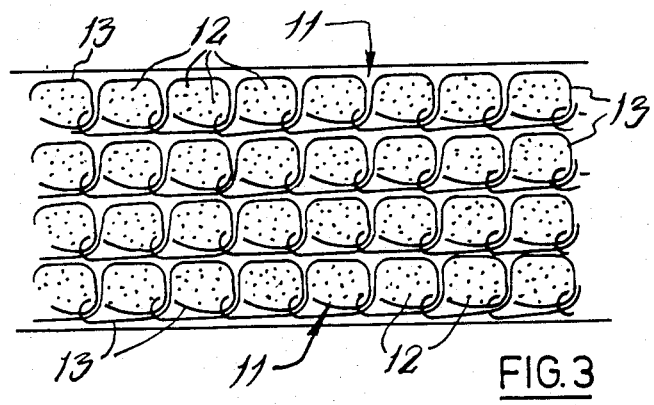
FIG. 3 is a cross-section through a multilayer board.

The boards illustrated in FIGS. 1 to 3 comprise stitch bonded fabric 11 comprising high temperature fibres 12, for example of Nomex (Registered Trade Mark) impregnated with resin, the resin being cured by hot pressing.

The fabric is warp thread stitch bonded fabric, of which the stitching threads 13 are also of high temperature material, and is preferably stitch locked by the thread stitches being interengaged by fibre loops drawn in the stitching process from the fibre fleece which is being stitched. Stitch locking is helpful in that the fabric can be handled before the impregnation and curing stages without risk of stitching threads pulling out which could lead to partial disintegration and handling difficulties.

The board shown in FIGS. 1 and 2 has a single layer of such fabric 11 which, together with the resin, has been hot pressed into a thin, flat board. Vacuum and pressure impregnation, such as is used in coil making, ensures that there are no internal voids or air spaces giving rise to regions with reduced electrical resistance. This is especially the case if solventless resins are used as referred to above so that problems of solvent residues are eliminated.

One or both faces of this board can be plated with a metal layer suitable for etching to make a printed circuit board.

Thin boards like the one illustrated in FIGS. 1 and 2 can be easily guillotined or otherwise cut to size leaving good, non-fraying edges and can be drilled for insertion of electrical or electronic components.

A thicker board is shown in cross-section in FIG. 3, and has four layers of fabric 11. Such a board is useful for mounting heavier electrical components, switch gear and the like. The production of this board is similar to that of the thin board. The inherent flexibility and workability of the fabric may be of some advantage in making thicker boards in that the fabric can be folded into layers, which might be easier than using separate pieces. And, of course, the fabric layers can be stitched or basted together in a sub-assembly step prior to impregnation—using high temperature stitching thread, which does not then have to be removed.

What I claim is:

1. An electrically insulating board comprising a stitch bonded fabric comprising high temperature fibres impregnated with resin, the resin being cured by hot pressing.

2. A board according to claim 1, said stitch bonded fabric comprising a yarn stitch bonded fabric.

3. A board according to claim 2, said yarn stitch bonded fabric being stitch locked.

4. A board according to claim 2, of which the stitching yarn also comprises high temperature fibre.

5. A board according to claim 1, said stitch bonded fabric comprising a non-yarn stitch bonded fabric.

6. A board according to claim 1, said resin being a solventless resin.

7. A board according to claim 1, comprising a plurality of layers of stitch bonded fabric.

8. A board according to claim 7, in which said layers are stitched together.

9. A printed circuit board comprising a base of an electrically insulating board according to claim 1.

10. A rotor of a printed circuit motor, said rotor comprising a printed circuit board according to claim 9.

* * * * *